United States Patent [19]

Kimura et al.

[11] Patent Number: 5,794,839
[45] Date of Patent: Aug. 18, 1998

[54] BONDING MATERIAL AND BONDING METHOD FOR ELECTRIC ELEMENT

[75] Inventors: Yuji Kimura, Nagoya; Kinya Atsumi, Okazaki; Katsunori Abe, Chita-gun; Noriyuki Matsushita; Michiyo Mizutani, both of Nagoya; Tetsuo Toyama, Chiryu, all of Japan

[73] Assignee: Nippondenso Co., Ltd., Kariya, Japan

[21] Appl. No.: 509,234

[22] Filed: Jul. 31, 1995

[30] Foreign Application Priority Data

Aug. 1, 1994 [JP] Japan .................. 6-179935
Oct. 28, 1994 [JP] Japan .................. 6-264719
Jun. 7, 1995 [JP] Japan .................. 7-140175

[51] Int. Cl.$^6$ ............................ H01L 21/58
[52] U.S. Cl. .................. 228/123.1; 228/124.1
[58] Field of Search ............. 228/123.1, 124.1, 228/180.21, 180.22; 420/512

[56] References Cited

U.S. PATENT DOCUMENTS

| | | | |
|---|---|---|---|
| 4,418,857 | 12/1983 | Ainslie et al. | 228/124.1 |
| 5,197,654 | 3/1993 | Katz et al. | |
| 5,234,149 | 8/1993 | Katz et al. | 228/123.1 |
| 5,559,819 | 9/1996 | Abe et al. | 372/46 |

FOREIGN PATENT DOCUMENTS

| | | | |
|---|---|---|---|
| 055368 | 7/1982 | European Pat. Off. | |
| 055378 | 7/1982 | European Pat. Off. | |
| 082271 | 6/1983 | European Pat. Off. | |
| 119691 | 9/1984 | European Pat. Off. | |
| 20228 | 11/1944 | Finland | 420/512 |
| 4205982 | 6/1980 | Germany | 420/508 |
| 60-17175 | 5/1985 | Japan | |
| 63-224895 | 9/1988 | Japan | |
| 878032 | 9/1961 | United Kingdom | |
| 1297467 | 11/1972 | United Kingdom | |
| 1548755 | 7/1979 | United Kingdom | |
| 2049522 | 12/1980 | United Kingdom | |

*Primary Examiner*—Kenneth J. Ramsey
*Attorney, Agent, or Firm*—Cushman, Darby & Cushman IP Group of Pillsbury, Madison & Sutro LLP

[57] ABSTRACT

A material and method for bonding a semiconductor device to a pedestal, which can obtain a sufficient bonding strength and stable electric contact, are disclosed. On an n-type electrode constituting an ohmic electrode for a semiconductor laser device are formed a Ni layer and an Au-Sn solder layer. Then, the solder layer is melted and bonded to a heat sink provided with Au-plating. The film thickness of the Ni layer is set to approximately 500 Å or more. When the solder layer is melted, Ni in the Ni layer diffuses into the solder layer and Sn in the solder layer diffuses into the Ni layer. By this mutual diffusion, bonding strength and wettability between the semiconductor device and pedestal can be improved. In addition, by setting the composition ratio of Ni layer to the Au-Sn solder layer to 1.3 wt % or more and under 10 wt %, bonding can be performed at a lower melting point and concurrently a higher bonding strength can be obtained.

30 Claims, 6 Drawing Sheets

BONDING MATERIAL AND BONDING METHOD FOR ELECTRIC ELEMENT

CROSS REFERENCE TO RELATED APPLICATION

This application is based upon and claims the benefit of priority of the prior Japanese Patent Applications No. 6-179935 filed on Aug. 1, 1994, No. 6-264719 filed on Oct. 28, 1994 and No. 7-140175 filed on Jun. 7, 1995, the contents of which are incorporated herein by reference.

BACKGROUND OF THE INVENTION

1. Field of the Invention

The present invention relates to a bonding material and a bonding method for electric elements (devices), such as semiconductor laser devices, to be soldered to a pedestal.

2. Related Arts

In soldering a semiconductor device, such as semiconductor laser device, to a pedestal plated with Au, such as heat sink, stem and circuit board, formed pellets of eutectic solder, such as Au-Sn and Pb-Sn, have conventionally been used. For the formed pellets, for the reason of manufacturing method and handling convenience, the individual size thereof should be hundreds μm×hundreds μm and the film thickness thereof should be at least tens μm.

To satisfy these requirements, the volume of the solder layer may be excessively large. Consequently, when soldering a semiconductor device to a pedestal, the position of the semiconductor device may slide or protuberance may be formed in the periphery of the semiconductor device. When a semiconductor laser device is used as the semiconductor device to be bonded, there is a problem that the protuberant solder layer may disturb the laser light.

A technique developed to solve this problem is disclosed in the European Patent Publication No. 0119691A2. This technique does not use any formed pellet but provides on the semiconductor laser device a barrier layer consisting of Pd or Pt, a comparatively thick Au electrode and a Sn layer formed by means of evaporation to thereby form an eutectic layer of Sn and Au in preparation for mounting. Another technique similar to this is disclosed in the U.S. Pat. No. 5,197,654.

However, even if the solder layer is formed to be thinner, there is a problem that, if wettability between the solder layer and the mounting surface is poor, partial connection may be caused due to a small volume of solder and therefore a sufficiently high bonding strength and a sufficiently low resistance in connection can not be obtained.

SUMMARY OF THE INVENTION

In view of the above problem, the present invention has an object to bond a semiconductor device to a pedestal so that a sufficient bonding strength and a stable electric connection can be obtained.

The inventors of the present invention paid attention to the fact that Sn and Ni are highly compatible with each other and can form an intermetallic compound.

As an ohmic electrode for a GaAs substrate, a stack of Ni and Au on an alloy of Au and Ge (hereinafter this type structure will be expressed as Au-Ge/Ni/Au) has been well known. In this structure, it is said that when the film thickness of Ni is increased, contact resistance thereof increases, and therefore, Ni is used with a thickness of approximately 200 Å. In this case, Ni is used as a barrier

2 electrode for preventing the diffusion of the surface Au. For this reason, the inventors of the present invention considered using this metal system and tried to deposit by means of evaporation a solder containing Sn thereon and solder the same to a pedestal such as heat sink.

However, there was a problem caused that Au on Ni had diffused into the solder layer and the bonding strength and wettability of the solder were aggravated.

To counter this problem, the inventors of the present invention tried soldering without providing the Au layer and found that the wettability had been improved and stable soldering with a high bonding strength had been achieved. This was achieved by the fact that Ni had diffused into the solder layer and Sn in the solder layer had diffused into Ni, i.e., mutual diffusion occurred, and as a result, the bonding strength and wettability of the solder had been improved.

Furthermore, in bonding the semiconductor laser device, it is preferable to select a bonding material which can lower the bonding temperature to thereby alleviate heat damage to the semiconductor laser device. The inventors of the present invention studied with this respect from various aspects and discovered, as described later, that if the Au-Sn solder is used, Ni diffuses into the Au-Sn layer to form an Au-Sn-Ni alloy and thereby lower the bonding temperature.

The present invention is based on the above various trials and discoveries. Specifically, the present invention is characterized by the following:

The bonding material according to the present invention is a bonding material, for bonding an electric element to a pedestal, which is composed of an alloy of Au-Sn-Ni with Au as a main component, and characterized by the composition ratio of Ni to be 1.3 wt % or more and under 10 wt %.

In the above bonding material, the An-Sn-Ni alloy can be provided on a bonding part by forming a stacked structure with an Au-Sn alloy layer with Au as a main component and a Ni layer on the bonding part and heating the same.

Furthermore, a mounting method for an electric element according to the present invention is characterized by a mounting method comprising the steps of: forming an electrode layer on an electric element; forming a Ni layer on the electrode layer; forming a solder layer containing Sn directly on the Ni layer; and heating the solder layer to obtain a mutually diffusion between the solder layer and the Ni layer and an ohmic contact of the electrode layer with respect to the electric element as well to bond the electric element to a pedestal.

According to the present invention, the bonding material is composed of an alloy of Au-Sn-Ni with Au as the main component and the composition ratio of Ni is set to 1.3 wt % or more and under 10 wt %. Therefore, bonding with a high strength can be made at a low melting point and at the same time the increase in contact resistance can be restrained.

Furthermore, according to the bonding method of the present invention, the Ni layer and the solder layer containing Sn are formed on the electrode of the electric element, and the solder layer is melted to be bonded to the pedestal.

Here, mutual diffusion, i.e., Ni in the Ni layer diffuses into the solder layer and Sn in the solder layer diffuses into the Ni layer, occurs during the melting of the solder layer. By this mutual diffusion, the Au-Sn-Ni alloy can be obtained, and the bonding strength and wettability of the solder can be improved without using any formed pellet of eutectic solder.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Now description will be given to the embodiments of the present invention applied to a semiconductor laser device.

A semiconductor laser device is a structure in which each working region is provided in a crystal formed by means of epitaxial growth on a GaAs or InP substrate. Generally, an n-type substrate is used in this application. As a material system, GaAs-AlGaAs system, InGaAsP-InP system, InGaP-InGaAlP system, etc. can be used. As an epitaxial growth method, liquid phase epitaxy, molecular beam epitaxy (MBE), metal organic chemical vapor deposition (MOCVD), etc. can be used. As an active layer, a double hetero structure, a quantum well structure, etc. can be used.

Figure 1:
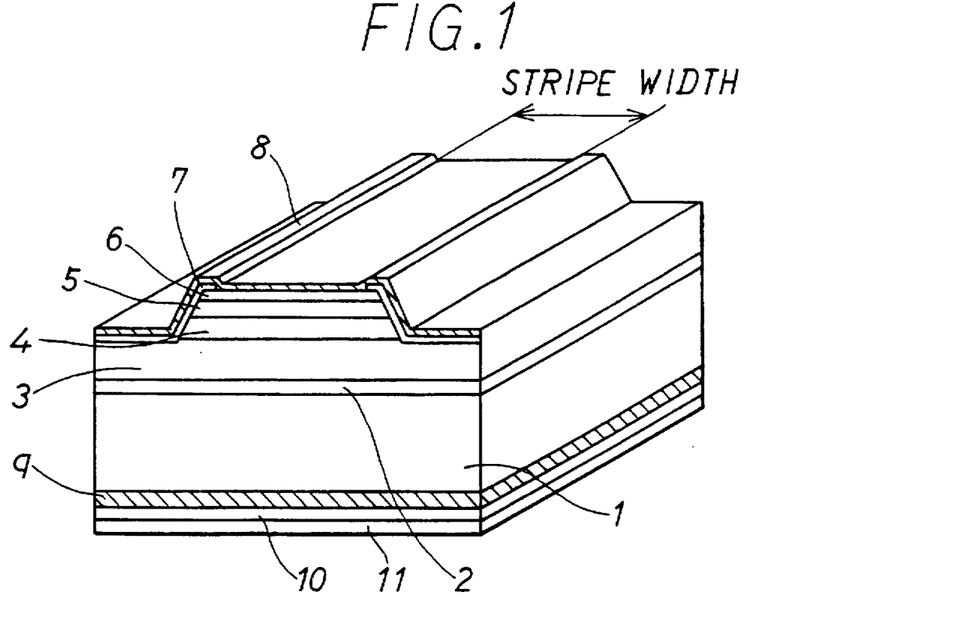
FIG. 1 is a perspective view illustrating a semiconductor laser device of an embodiment where the present invention is applied to the semiconductor laser device.

FIG. 1 is a perspective view of a semiconductor laser device before being bonded to a pedestal, to which this embodiment is applied.

On an n-GaAs substrate 1 are stacked an n-GaAs buffer layer 2, an n-AlGaAs clad layer 3, an active layer 4 having an AlGaAs/GaAs multiquantum well structure, a p-AlGaAs clad layer 5 and a P-GaAs layer 6 in this order. The active layer 4 through the p-GaAs layer 6 are formed to be of mesa shape. On the top of the n-AlGaAs clad layer 3 and the mesa part is formed an insulating film 7 of SiO$_2$ or the like with a window part therein. On the insulating film 7 is formed a p-type electrode (upper electrode) 8.

The p-type electrode 8 is made of a film formed by making a film to a specified thickness by electron beam evaporation, sputtering or the like. For the p-type electrode 8, Au-Zn/Au, Cr/Au, Mo/Au, Ti/Pt/Au, etc. can be used. Other materials can also be used as long as ohmic contact is attained.

On the back of the n-GaAs substrate 1 is formed an n-type electrode (lower electrode) 9 of Au-Ge. On the surface of the n-type electrode 9 is formed a bonding material comprising an Ni layer 10 and a solder layer 11.

The semiconductor laser device so constructed as described above is bonded to a heat sink, another semiconductor substrate, a circuit board, etc. The method of these mountings will now be described.

Figure 2:
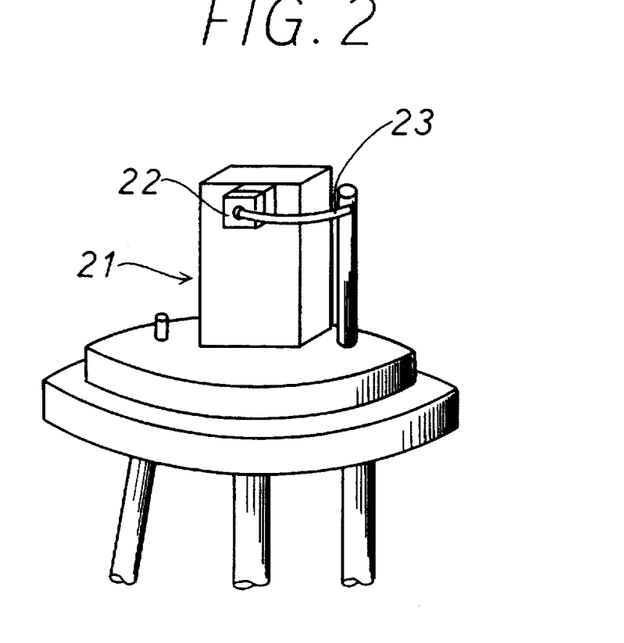
FIG. 2 is a perspective view illustrating the state that the semiconductor laser device has been die-bonded to a heat sink.

A plurality of the semiconductor laser devices illustrated in FIG. 1 are stacked and disposed on a heat sink 21 as shown in FIG. 2. The stacked laser structure is indicated by numeral 22 in FIG. 2. In this case, the bonding material of the upper semiconductor laser device is positioned on the p-type electrode of the lower semiconductor laser device.

The heat sink 21 is made of Cu, Fe or the like, and the surface thereof is provided with a highly conductive metal, such as Ni and Au, formed by means of plating, evaporation, sputtering or the like. A plurality of semiconductor laser devices are positioned to each other and stacked on the heat sink 21. At this time, vacuum tweezers are used for carrying chips, and it is preferable to use the vacuum tweezers which also function as a pressurizing part when the devices are heated by a heater because the use of such vacuum tweezers makes it easier to obtain the required positional accuracy.

The semiconductor laser devices stacked on the heat sink 21 are pressurized while being held not to move, and then heated to melt the respective solder layer 11 for bonding. After the temperature has reached the level that can melt the solder layers 11, the semiconductor laser devices are left at this temperature for the duration from seconds to minutes and then cooled. There are some methods of heating all the semiconductor laser device while the heat sink and the semiconductor laser chips are fixed not to move. For example, heating is applied in a thermostatic bath, or heating is applied from the back side of the heat sink by a heater or the like. The latter method is preferable for easier handling of the equipment.

After the above die bonding, the upper electrode and a driving circuit wiring are bonded to each other with a wire 23 made of Au, Pt or the like to attain electric contact to the semiconductor laser. Then, the whole unit is sealed in a can, if necessary, to complete the semiconductor laser.

Now, description will be given to the forming of the above n-type electrode 9, Ni layer 10 and solder layer 11 and the bonding thereof to the heat sink 21. The composition of this portion is illustrated in FIG. 3.

On the back surface of the n-GaAs substrate 1 is formed an Au-Ge layer as the n-type electrode 9. Instead of Au-Ge, other materials can be used for the n-type electrode 9 as long as an ohmic electrode can be formed, such as Au-Zn/Au, Cr/Au, Ti/Pt/Au, Au-Ge/Ni/Au, Au-Sn/Au, and an alloy layer thereof. Such materials are formed on the back surface of the n-GaAs substrate 1 to a specified thickness by means of electron beam evaporation (vacuum deposition), resistance heating evaporation, sputtering or the like.

Next, the Ni layer 10 is formed on the n-type electrode 9 in the same way. Then, as the solder layer 11, an alloy containing Sn, such as Au-Sn and Pb-Sn, is formed on the Ni layer 10. The method of forming the solder layer 11 will be described later.

Figure 3:
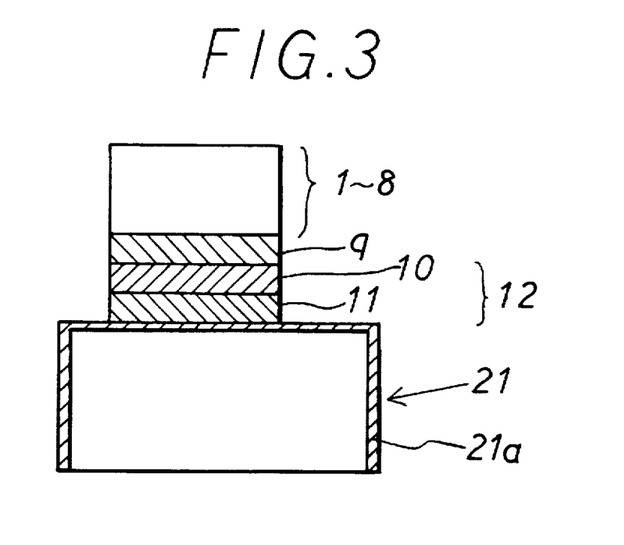
FIG. 3 is a schematic view illustrating the construction when an n-GaAs substrate with an n-type electrode, Ni layer and solder layer formed on the back side thereof is bonded to a pedestal such as a heat sink.

The electrode 9/Ni layer 10/solder layer 11 containing Sn formed as described above are laid on the heat sink 21 provided with plating 21a of Ni, Au or the like as illustrated in FIG. 3, then pressurized and heated to mutually melt the solder layer 11 and the Ni layer 10, and then cooled, so that the semiconductor laser device is mounted on the heat sink 21. As a result of this heat treatment, the electrode 9 is sintered and ohmic contact with the substrate 1 is attained.

It is also acceptable that the formed electrode 9/Ni layer 10/solder layer 11 containing Sn are heated to approximately 360° C. to attain the ohmic contact of the electrode 9 and concurrently form an eutectic layer of the Ni layer 10 and the solder layer 11 containing Sn. Then, the substrate 1 with the eutectic layer is laid on the heat sink 21 provided with the plating 21a of Ni, Au or the like, then pressurized and heated to a temperature higher than the melting point of the eutectic layer to melt the eutectic layer, and then cooled, so that the semiconductor laser device is mounted on the heat sink 21.

As soldering materials, Au-Sn, Au-Si, In, In-Pb, Pb-Sn, Au-Pb, Au-Ge, etc. are available. Among these materials, a good wettability of the solder and a high bonding strength can be attained by stacking the Ni layer and the solder layer containing Sn, such as Au-Sn and Pb-Sn. Particularly, this effect is conspicuous when Au-Sn is used as the solder layer.

The Ni layer 10 has a role of barrier electrode preventing a mutual diffusion of the soldering material and the electrode and a role of improving the wettability of the solder by diffusing into the solder layer 11. In particular, when Au is used on the top layer of the electrode 9, the stability of contact is degrade as Au is active and diffuses at a low temperature into the solder layer for soldering. Therefore, a barrier electrode is necessary, and particularly when the electrode is made of Au or an alloy containing Au, the barrier electrode is effective.

The film thickness of Ni as a barrier electrode should be at least 200 Å. If the Ni layer is thinner than 200 Å, the Ni layer will be islandish losing the role of the barrier metal.

Figure 4:
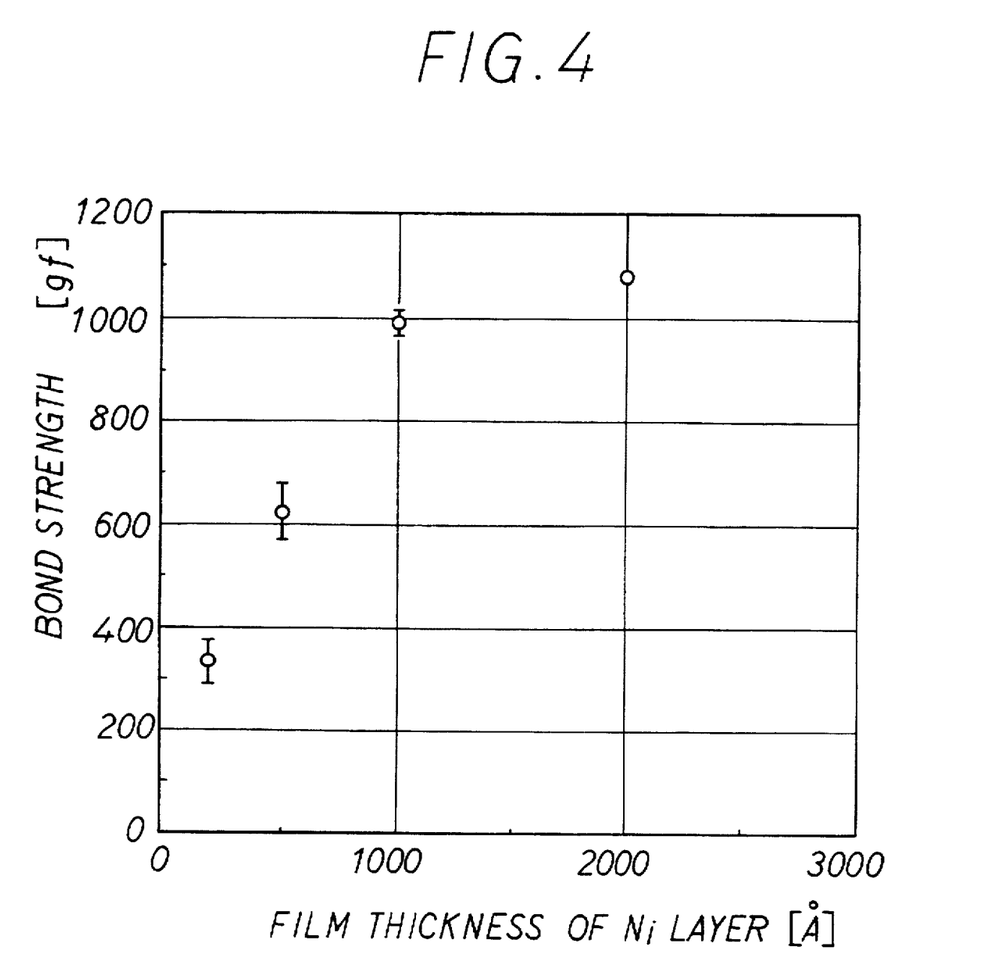
FIG. 4 is a characteristic diagram indicating the relationship between the thickness of the Ni layer and the bonding strength measured on a vibration test.

FIG. 4 illustrates the dependence of the strength of the bonding layer on the thickness of the Ni layer in a case where a film of Au-Ge electrode was formed to a thickness of 1,000 Å on an n-GaAs substrate of 0.5 mm×0.5 mm in size and Ni/Au-Sn (Au and Sn are eutectic) were stacked on the electrode and subjected to a vibration test. The vibration test was conducted under Condition D of JIS C7022A-10 within a frequency range of 10 Hz to 2,000 Hz with an acceleration of 20G in 3 directions for 48 minutes. The thickness of the Au-Sn solder layer 11 was fixed to 1.5 μm.

As the film thickness of the Ni layer 10 increased, the bonding strength increased, and no difference was seen in the bonding strength when the thickness of Ni is 1,000 Å or more. When the film thickness was 1,000 Å or more, the substrate was broken during the test, and therefore, the bonding strength is supposed to be more than that shown in the figure. When the film thickness was 200 Å, the layer was peeled and a sufficient bonding strength was not obtained. As the bonding strength of 500 gf or more ensures so sufficient bonding as to clear various reliability tests, the Ni layer must be thickened to 500 Å or more.

Now, how to form the solder layer 11 will be described.

To form the solder layer 11, stacking of the composing materials of the alloy, such as Au-Sn was tried. In this case, the composition ratio can freely be designed and the materials to be evaporated can easily be controlled.

In this case, however, if the film thickness of each layer varies, the composition variation will occur. Generally, it is customary that eutectic composition is used for designing the composition ratio of the solder. Therefore, if the composition variation occurs, the melting point rises. If the melting point changes in this way, the mounting conditions must be changed accordingly. If the same conditions are applied, the solder may not melt, or even if the solder melts, the solder will not completely melt. As a result, a constant bonding strength can not be obtained after mounting.

To solve the problem, a study was made to form a film of the alloy, such as Au-Sn, Pb-Sn, In, In-Pb, Au-Si and Au-Pb, as the solder layer 11 by vapor growth, that is, to form the solder layer 11 by means of physical vapor growth using the above alloy as an evaporation source.

The physical vapor growth referred to herein, which is called "physical vapor deposition (PVD)," is a method which does not use any chemical reaction but uses only the physical reactions, such as evaporation, sputtering and ion-plating, for forming thin film. The physical vapor deposition may be paraphrased as a phenomenon that the material itself to be formed on a substrate reaches the substrate in the state of vapor or cluster and forms a thin film. On the other hand, the methods using chemical reactions includes "chemical vapor deposition (CVD)." In this method, the source material is decomposably reacted within a vapor phase using energy, such as heat, plasma and light, to form a thin film through chemical reaction. The CVD is different in the principle of film formation from the PVD.

By forming the solder layer 11 in this way, even if the film thickness varied from layer to layer, almost no change was seen all the time in the melting point, and the above problem could be solved.

As film-forming methods by means of vapor phase growth, electron beam evaporation, resistance heating evaporation, sputtering, etc. can be used. Among these, in the electron beam evaporation and the resistance heating evaporation, the composition ratio in the product slightly varies from the composition ratio in the source material due to difference in the vapor pressure of the alloy. Therefore, it is preferable to use the sputtering method for film formation. When the electron beam evaporation or the resistance heating evaporation is used, if almost all the source material is completely evaporated, there is no change in the composition ratio between the source material and the deposited film. In addition, even if all the material is not evaporated, as the composition ratio depends on the vapor pressure, the composition ratio of the film does not vary from batch to batch.

A conventional technique using formed pellets as a soldering material has a problem that protuberances caused by excessive solder may cover the light emitting layer and disturb the light output therefrom. However, by forming a thin film for the solder layer 11 by means of vapor growth, there is no excessive overflow of the solder, and a solder layer having a highly reproducible composition ratio can be obtained, whereby a stable bonding with a high bonding strength can be achieved.

The film thickness of the above solder layer 11 will now be described.

By using vapor growth for forming a thin film for a solder layer, excessive overflow of solder can now be prevented. However, when a plurality of semiconductor laser devices are stacked as described above, there is a problem that if the solder layer is comparatively thick, the solder overflow covers the light emitting layer. In addition, the same problem occurs when the electrode on the side near the light emitting layer is soldered (in such a case as the second example described herein later). Reversely, if the solder layer is thin, there is a problem that bonding strength is low.

Figure 5:
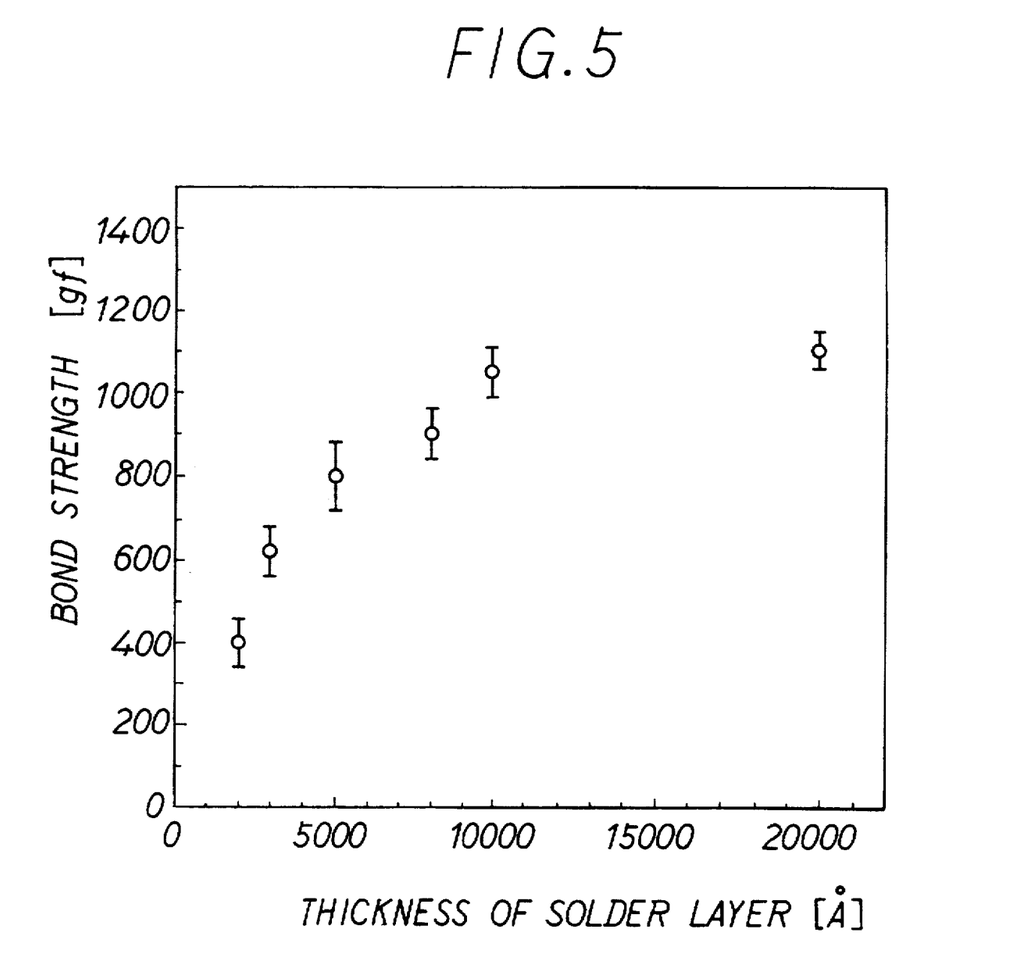
FIG. 5 is a graph indicating the relationship between the thickness and the bonding strength of the solder layer.

FIG. 5 illustrates the relation between the thickness and bonding strength of the solder layer when a semiconductor laser device of 0.5 mm×0.5 mm in size is mounted on a copper heat sink plated with Au.

The bonding strength increases as the film thickness of the solder layer increases, and no difference is seen in the bonding strength when the film thickness is 1 μm or more.

As the substrate was broken when the film thickness is 1 µm or more, the strength is supposed to be more than that shown in the figure. It has been found that a bonding strength of 500 gf or more is sufficient and can pass various reliability tests. Therefore, there is no such problem if the solder layer has a thickness of 3,000 Å or more.

The thickness of the solder layer has a relation with the surface roughness (Ra) of the bonding surface, which was 1,000 Å in this measurement. Generally, the film thickness of the solder layer should be thicker than the surface roughness, and it is found from the results of this test that the solder layer should be approximately three times as thick as the surface roughness. In mounting, a stem with a bonding surface having a surface roughness (Ra) of 500 Å to 2,500 Å was used. Usually as the stem having a surface roughness of 1,000 Å are used, the thickness of the solder layer should be at least 3,000 Å, and preferably be 5,000 Å or more.

The bonding strength increases as the film thickness of the solder layer increases. However, when the solder layer becomes thicker, there is a problem of the overflow of the soldering material. Particularly, when a plurality of semiconductor laser devices are stacked, the overflow of the soldering material covers the light emitting layer. Furthermore, to form a thicker solder layer, longer time and more material to be evaporated are required. There is little overflow of the soldering material when the solder layer is under 1 µm. However, when the thickness thereof is over 1 µm, the soldering material overflows from the back surface of the chip. When the solder layer has a thickness of over 3 µm, the soldering material sticks to the light emitting surface side, and when the solder layer has a thickness of over 4 µm, the soldering material partly covers the light emitting layer. From these results, it is advisable that the film thickness of the solder layer be under 3 µm.

Therefore, by setting the film thickness of the solder layer 11 to 0.3 µm (3,000 Å) to 3 µm, a bonding with a high bonding strength can be obtained. In addition, when a plurality of semiconductor laser devices are stacked, the soldering material of the stack part does not cover the light emitting layer, whereby a stable light output with a high bonding strength can be obtained.

Examples of the fabrication of a semiconductor device using the above solder layer 11 will now be described.

(First Example)

A semiconductor laser device of a GaAs/AlGaAs system was made on an n-GaAs substrate, and the side of the n-type electrode thereof was soldered to a copper heat sink plated with Au. At this time, three semiconductor laser devices were stacked up. As an n-type electrode, a layer composed of 88 wt % of Au and 12 wt % of Ge was formed to a thickness of 1,000 Å. On this n-type electrode were provided Ni layer of 1,000 Å thick and Au-Sn solder layer of 1 µm thick. At this time, the film of Au-Ge/Ni was formed by means of electron beam evaporation, and the solder layer was formed by means of sputtering. The size of the semiconductor laser device was 500 µm×600 µm×110 µm. Three semiconductor devices were stacked up on the copper heat sink plated with Au and mounted thereon at a heating temperature of 340° C. and a pressure of 60 g. The devices mounted had no overflow of the soldering material thereof and no covering on the light emitting layer by the soldering material thereof. When a test was conducted on this example at a variable frequency of 10 Hz to 2,000 Hz and 20 G/sec² for 48 minutes in three directions, no change was recognized. The bonding strength of the device was measured on a shear tester, and found to be over 1 kgf.

(Second Example)

A semiconductor laser device of an InGaP-InGaAlP system was made on an n-GaAs substrate, and the side of the p-type electrode thereof was soldered to the copper heat sink plated with Au. As a p-type electrode, films of Ti of 1,000 Å thick, Pt of 2,000 Å thick and Au of 3,000 Å thick were formed respectively, and on these films were provided Ni layer of 800 Å thick and Au-Sn solder layer of 0.8 µm thick. At this time, the films were formed by means of electron beam evaporation. The size of the semiconductor laser device was 600 µm×700 µm×110 µm. The p-type electrode was soldered. However, the soldering material did not cover the active layer, and therefore, a good light emission could be obtained. In addition, a bonding strength of 1 kgf or more was obtained, whereby a stable contact was achieved.

(Third Example)

A GaAs electric field effect transistor was made on a semi-insulating GaAs substrate and soldered to a printed circuit board plated with Au. On the back surface of the semi-insulating GaAs substrate were provided Ni layer of 1,000 Å thick and Au-Sn solder layer of 2 µm thick. The films were formed by means of sputtering. The size of the device was 500 µm×600 µm×180 µm. The device was mounted at a heating temperature of 360° C. and a pressure of 100 g. The bonding strength of the device was measured on a shear tester, and found to be 1 kgf or more.

Now, description will be given to the bonding materials using solder.

When the above semiconductor laser device is bonded to a heat sink, it is effective to set the temperature, pressure, pressurizing time, etc. for bonding to larger values, for improving the wettability or the bonding strength. However, As out of GaAs used as a material of the semiconductor laser device has a low sublimating temperature, and therefore, a high bonding temperature aggravates the thermal damage to the device. In addition, a high pressure and a long pressurizing time also aggravate the mechanical damage to the light emitting layer.

Therefore, in bonding semiconductor laser devices, a bonding material which lowers the bonding temperature and alleviates the thermal damage to the semiconductor laser device should be selected.

The inventors of the present invention made studies on the above problem from various aspects and found that a melting point lower than that of the pellet composed of 80 wt % of Au and 20 wt % of Sn could be obtained when a Au-Sn system solder was used as the solder layer 11 and a stacked structure of Ni/(Au 80 wt %-Sn 20 wt %) was employed. The reason for this is that Ni diffuses into the Au-Sn layer and composes an Au-Sn-Ni alloy.

Based on the above, the film thickness of Ni was varied to change the concentration of Ni thermally diffusing into the Au 80 wt %-Sn 20 wt % layer and a state diagram was drawn. The results are illustrated in FIG. 6.

Figure 6:
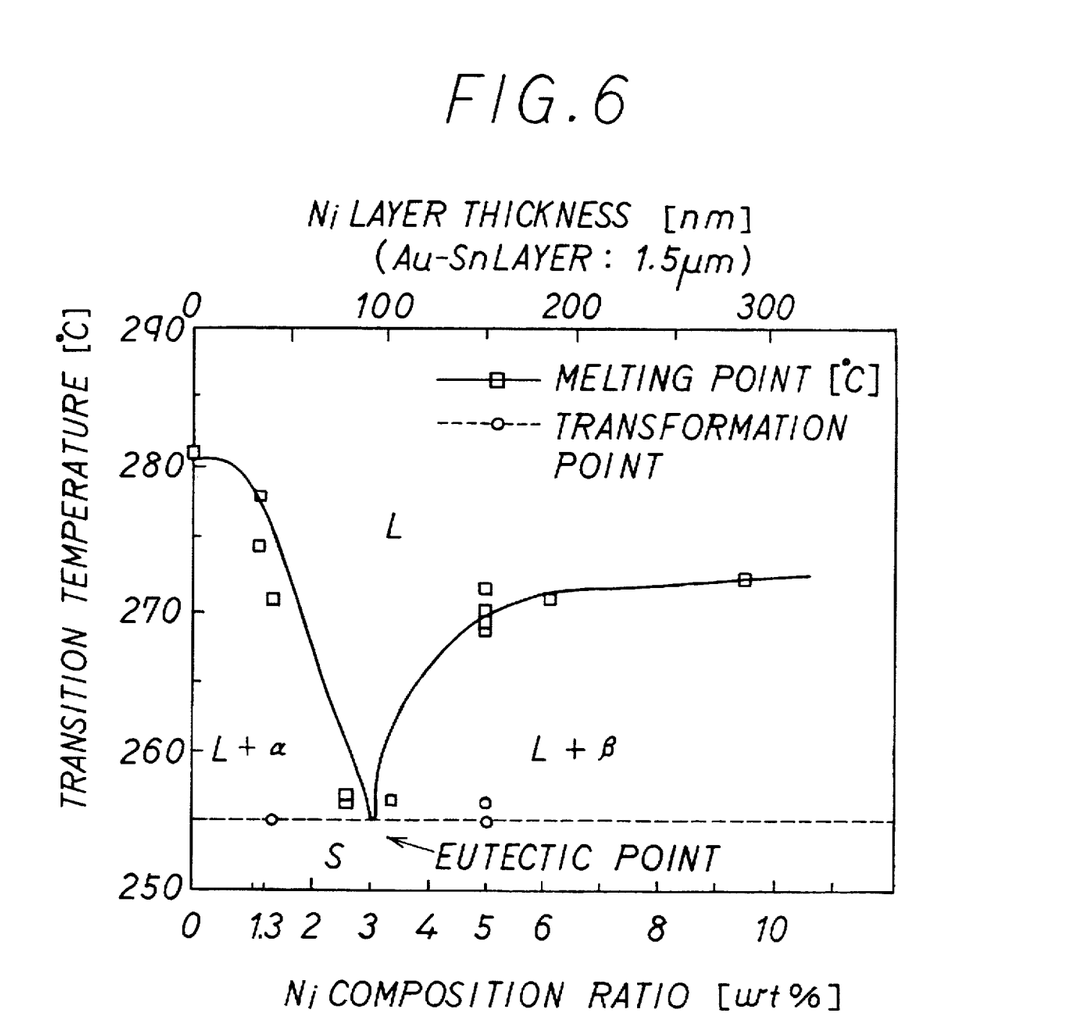
FIG. 6 is a graph indicating the variation in the melting point when the composition ratio of Ni thermally diffused into an Au 80 wt %-Sn 20 wt % layer was varied.

In FIG. 6, letters L and S denote the liquid phase and the solid phase, respectively, and α and β denote the solid solution of Au-Sn-Ni, respectively. Therefore, letters (L+α) and (L+β) indicate the mixed state of the liquid phase and solid phase, respectively. The upper axis of abscissa indicates the film thickness of Ni layer when the thickness of the Au 80 wt %-Sn 20 wt % layer is set to 1.5 µm in the Ni/(Au 80 wt %-Sn 20 wt %) multilayer structure.

In this state diagram, the melting point of the (Au 80 wt %-Sn 20 wt %)-Ni alloy becomes lower than that of Au 80 wt %-Sn 20 wt % pellet as the amount of Ni increases. When the composition ratio of Ni (the weight ratio of Ni to the total weight of the bonding material) is 1.3 wt %, the melting point lowers by approximately 10° C.

Furthermore, when the amount of Ni is increased to have a composition ratio of approximately 3 wt %, the lowest melting point is obtained, and the melting point lowers by 25° C. or more down from that of the Au 80 wt %-Sn 20 wt % pellet. Therefore, the bonding temperature can be lowered by 25° C. or more down from that of the conventional bonding performed at the melting point of the Au 80 wt %-Sn 20 wt %, whereby the thermal damage to the devices can be reduced.

The above effect and the effect described later are obtained by the diffusion of Ni into the Au-Sn layer and the composition of a Au-Sn-Ni alloy. Therefore, the effect can be obtained not only by the stacked structure of Ni/(Au 80 wt %-Sn 20 wt %) and but also by an layer of (Au 80 wt %-Sn 20 wt %)-Ni alloy.

Figure 7:
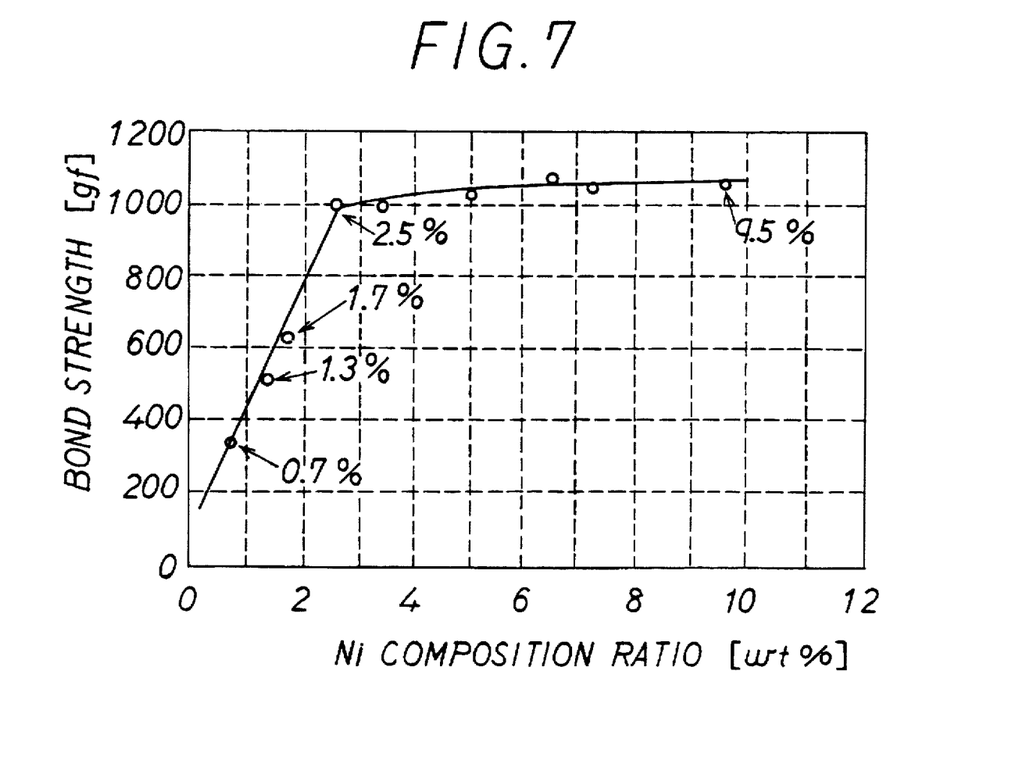
FIG. 7 is a graph indicating the relationship between the composition ratio of Ni in the Au 80 wt %-Sn 20 wt % layer and the bonding strength.

FIG. 7 illustrates the relation between the composition ratio of Ni in an Au 80 wt %-Sn 20 wt % layer and the bonding strength thereof. From this figure, it is understood that the bonding strength increases as the composition ratio of Ni increases but saturates when the composition ratio is 2.5 wt % or more. In the experiment, the bonding strength was measured for the composition ratio up to 9.5 wt % and a sufficient of bonding strength was confirmed.

In the bonding strength test, in a structure with a Ni composition ratio of 0.7 wt %, peeling occurs at the bonding surface between the solder layer and the heat sink, but in a Ni composition ratio of 1.3 wt % or more, there was no peeling on the above bonding surface but the bonded device part was fractured. As it has been confirmed that, if the bonding strength was 500 gf or more, the devices could sufficiently withstand various reliability tests, the Ni composition ratio of 1.3 wt % or more results in a stable bonding strength.

In FIG. 7, when the Ni composition ratios were 1.3 wt % and 1.7 wt %, a pressure of 50 g was applied, and when the ratio was 2.5 wt % or more, no pressure was applied but the bonding was performed with the self-weight of the device alone. Therefore, it is understood that when the Ni composition ratio is set to 2.5 wt % or more, a sufficient bonding strength can be obtained with the self-weight of the device alone.

From these results, it is understood that by the addition of Ni to the Au 80 wt %-Sn 20 wt % layer, the melting point of the solder can be lowered and consequently the bonding strength can be improved. The composition ratio of Ni be 1 wt % to 10 wt % at which the melting point lowers by 10° C. or more. However taking the wettability and the bonding strength into consideration, it is preferable that the composition ratio of Ni should be 1.3 wt % or more. Furthermore, it is particularly preferable that the Ni composition ratio should be around 3 wt %, say, 2 wt % to 5 wt %, in a ternary alloy because a ternary eutectic alloy is formed to obtain the lowest melting point and the composition after the solder solidifies can be kept constant for a long time within this composition ratio range.

If the Ni composition ratio is controlled to be increased by thickening the Ni layer on the Au-Ge layer and the Ni composition ratio exceeds 10 wt %, an intermetallic compound between Sn and Ni is produced, and as such intermetallic compound is an insulator, the resistance value of the bonded part increases. Therefore, taking into consideration the increase in the resistance value of the bonded portion, it is preferable that the Ni composition ratio should be under 10 wt %.

As described above, in bonding a semiconductor laser device to a pedestal, etc., as a bonding material is a soldering material containing a constant amount of Ni in Au-Sn eutectic solder and by using a pedestal having a surface of Au layer, bonding with a good wettability and a high bonding strength can stably be obtained.

Here, also for an element of the above Ni/(Au 80%-Sn 20 wt %) stacked structure, it is preferable that the thickness of the Ni layer should be 500 Å or more as described above and the film thickness of the Au-Sn alloy solder layer should be within a range of 0.3 μm to 3 μm. Furthermore, as can been seen from FIG. 6, it is preferable that the thickness of the Ni layer should be around 90 nm, i.e., 70 nm to 120 nm, to make the Ni composition ratio around 3 wt % which obtains a three component eutectic point in case the Au-Sn eutectic alloy layer is 1.5 μm in thickness. In this case, for restraining the increase in the resistance value of the bonded portion, it is preferable that the thickness of the Ni layer should be under 300 nm.

Examples of fabrication using the above bonding material will be now described.

(Fourth Example)

A semiconductor laser device of a GaAs/AlGaAs system was made on an n-GaAs substrate, and the n-type electrode thereof was soldered to a copper heat sink plated with Au. As the n-type electrode, an Au 88 wt %-Ge12 wt % layer of 0.1 μm thick was formed, and on the n-type electrode were provided Ni of 0.1 μm thick and Au-Sn solder of 1.5 μm thick. At this time, the (Au-Ge)/Ni layers were formed by means of electron beam evaporation, and the solder layer was formed by means of sputtering. The size of the semiconductor laser device was set to 500 μm×600 μm×110 μm. The device was laid on the copper heat sink plated with Au and mounted thereon at a heating temperature of 340° C. without applying any pressure. When the device was subjected to a vibration test conducted at a variable frequency of 10 Hz to 2,000 Hz and 20G for 48 minutes in three directions, no change was recognized in comparison with the state before the test. The bonding strength of the device was measured on a tester and found to be approximately 1 kg. The composition ratio of the bonding material at this measurement was Au 77.3 wt %-Sn 19.3 wt %-Ni 3.4 wt %.

(Fifth Example)

A semiconductor laser device of an InGaP-InGaAlP system was made on an n-GaAs substrate, and the p-type electrode thereof was soldered to a copper heat sink plated with Au. As the p-type electrode, layers of Ti of 0.1 μm thick, Pt of 0.2 μm thick and Au of 0.3 μm were formed, and on the p-type electrode were provided Ni layer of 0.1 μm thick and Au-Sn solder of 1.0 μm thick. At this time, the films were formed by means of electron beam evaporation. The size of the semiconductor laser device was set to 600 μm×700 μm×110 μm. The p-type electrode was soldered at a heating temperature of 340° C. and a pressure of 30 g. As a result, the soldering material did not cover the active layer, and therefore, a good light emission could be obtained. Moreover, a bonding strength of 1 kgf or more was obtained, whereby a stable contact could be achieved. The composition ratio of the bonding material at this measurement was Au 76 wt %-Sn 19 wt %-Ni 5 wt %.

(Sixth Example)

To the top surface of the p-type electrode of a semiconductor laser device was soldered the n-type electrode side of the upper semiconductor laser device to have a stacked structure. As the p-type electrode, layers of Cr of 0.04 μm thick, Pt of 0.1 μm thick and Au of 0.5 μm were formed. As the n-type electrode, an Au 88 wt %-Ge12 wt % layer of 0.1 µm thick was formed, and on the n-type electrode were provided Ni layer of 0.1 µm thick and Au-Sn solder layer of 1.5 µm thick. At this time, the (Au-Ge)/Ni layers were formed by means of electron beam evaporation, and the solder layer was formed by means of sputtering. The size of the semiconductor laser device was set to 600 µm×700 µm×110 µm. The n-type electrode was soldered to the p-type electrode at a heating temperature of 340° C. and a pressure of 30 g. The bonding strength between the devices was measured on a shear tester and found to be over 500 kgf. At this time, the soldering material did not cover the active layer, and therefore, a good light emission could be obtained. In addition, by stacking the semiconductor laser devices, the light output could be increased. The composition ratio of the soldering material for bonding at this measurement was Au 77.3 wt %-Sn19.3 wt %-Ni 3.4 wt %.

In the above embodiments, heat sinks plated with Au, Ni, etc., were used as pedestals. However, the semiconductor laser device may also be soldered to a pedestal made of Fe, Cu or the like.

In the above, description was made as to semiconductor laser devices as semiconductor devices. However, the present invention may also be applied to other types of semiconductor devices. In this case, the present invention may also be applied to those using Schottky electrodes, as well as to those using ohmic electrodes. Among the materials which can be used for the Schottky electrode are Al, Pt, Au, Ta, Cr, W, Mo, Ti, Cu, Ag and Al-Si.

Furthermore, the present invention may also be applied to electric elements, such as a chip resistor and a chip capacitor, as well as the other semiconductor devices.

Another example of application of the above Au-Sn-Ni bonding material will now be described.

(Seventh Example)

Figure 8A:
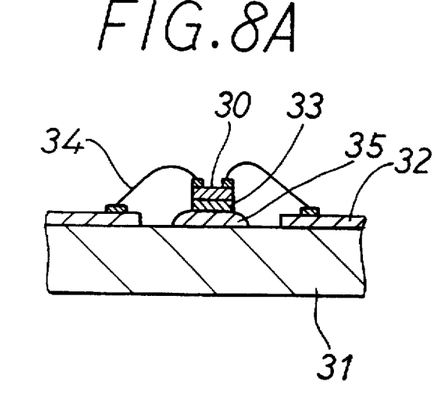
FIGS. 8A, 8B and 8C are views showing the construction where a driving IC for a display device has been mounted on a glass substrate.
Figure 8B:
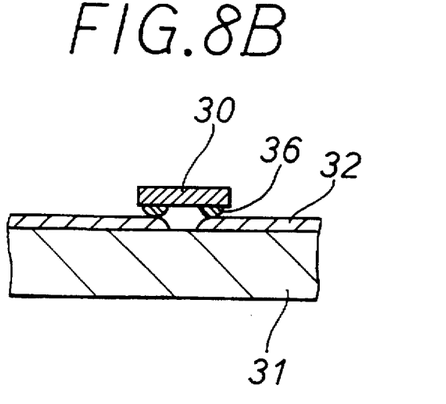
Figure 8C:
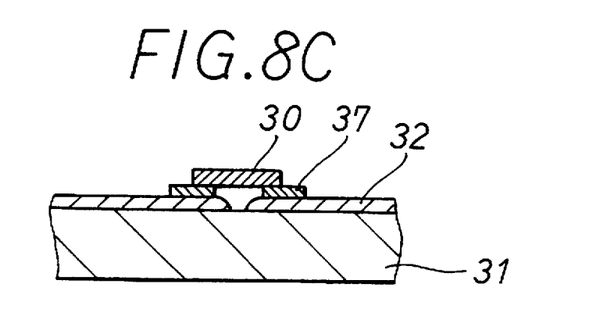

When a driving IC 30 for a liquid crystal display device, an electroluminescence (hereinafter referred to as EL) display device, etc. is mounted on a glass substrate 31 and connected to conductors (electrodes) 32, the compositions illustrated in FIGS. 8A, 8B and 8C can be used. FIG. 8A illustrates an application using a mount pad 33 and wires 34, FIG. 8B illustrates an application using bumps 36, and FIG. 8C illustrates an application using beam leads 37. The above Au-Sn-Ni bonding material is used as a bonding material for bonding the mount pad 33 to a mount part 35 in FIG. 8A, as the bump 36 in FIG. 8B, and as the beam lead 37 in FIG. 8C.

An example of mounting the driving IC 30 on an EL display panel by using the structure illustrated in FIG. 8A will now be described.

To make the EL display panel, a film of ITO (indium tin oxide), which is not shown, was formed to a thickness of 0.1 µm as the transparent electrode on the glass substrate 31 and processed to have a striped configuration. In a region where an EL device (not shown) is disposed, the EL device was formed on the glass substrate 31 as follows: a CaS:Eu layer was formed to a thickness of 1 µm as a luminescent layer by means of electron beam evaporation; a SiO$_2$ layer of 0.3 µm in thickness was formed as an insulating layer by means of RF plasma enhanced CVD; and an Al layer was formed to a thickness of 0.15 82 m and patterned to the specified pattern as a back electrode 32. Then, in a region where the driving IC 30 is located on the glass substrate 31, Ni film was formed to a thickness of 0.1 µm, and then an Au layer was formed to a thickness of 0.5 µm, and these films were patterned to the specified patterns to thereby provide the mount pad 35 and the wire-bonding pad of the electrode 32.

The films for the mount pad 35 and the wire-bonding pad were formed by means of sputtering. Then, another glass substrate was located over the EL device forming region of the substrate 31 to interpose the EL device therebetween and bonded with epoxy resin, and silicon oil was sealed therein to form a protecting layer for the EL device, so that the fabrication of the EL display panel was completed.

Next, a Ni layer was formed to a thickness of 0.2 µm on the back surface of the driving IC 30 to bond the driving IC 30 to the glass substrate 31, and then an Au 80 wt %-Sn 20 wt % layer was formed to a thickness of 2 µm thereon. Both the layers were formed by means of sputtering. The driving IC 30 was bonded to the mount pad 35 at a heating temperature of 350° C. and a pressure of 80 g. On the other hand, the pad for leading the EL panel wiring 32 was connected to the pad for leading the driving IC 30 with Au wires 34. In this way, the driving IC 30 was mounted on the glass substrate 31 with a constant bonding strength. The composition ratio of the bonding material 33 at the mounting was Au 76 wt %-Sn19 wt %-Ni 5 wt %.

(Eighth Example)

Figure 9:
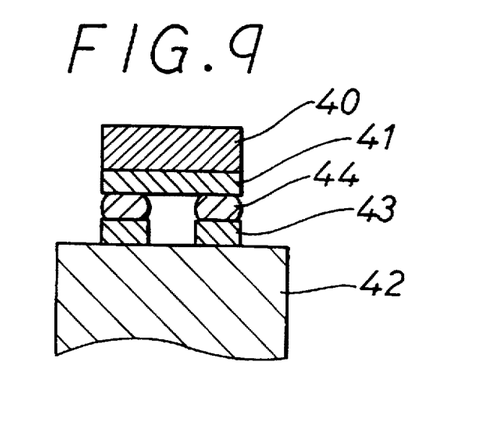
FIG. 9 is a view showing the construction where a semiconductor laser device has been mounted on a Si substrate provided with a SiN$_x$ optical guide.

FIG. 9 illustrates the application where semiconductor laser device 40 of a GaAs/AlGaAs system was bonded to a Si substrate 42 provided with a SiN$_x$ optical guide by using bumps 44. For the bumps 44, an Au 78 wt %-Sn 19.5 wt %-Ni 2.5 wt % bonding material was used, and the semiconductor laser device 40 was mounted on the Si substrate 42 by using four bumps each diameter of which is φ40 µm. The bumps 44 were formed on the Au pad 43 on the Si substrate 42. For the back surface electrode 41 of the semiconductor laser device 40, Au-Ge/Ni/Au layers were used with a thickness of 0.1 µm, 0.02 µm and 0.4 µm, respectively. The semiconductor laser device 40 was laid on the bumps 44, and the entire substrate 42 was loaded within a thermostatic bath to cause the bumps 44 reflowing, thereby soldering the device 40 to substrate 42. In this way, the semiconductor laser device 40 was mounted on the Si substrate 42.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electrical bonding assembly comprising:
   an electrical element having an electrode;
   a pedestal; and
   a bonding material bonding said electrode to said pedestal, said bonding material including an alloy consisting essentially of Au-Sn-Ni with Au as a main component;
   wherein a composition ratio of Ni is at least 1.3 wt % and said pedestal is composed of a material selected from the group consisting of Au, Ni, Fe and Cu on a surface to which said electrical element is to be bonded.

2. An electrical bonding assembly comprising:
   a semiconductor laser device having an electrode;
   a pedestal; and
   a bonding material bonding said electrode to said pedestal, said bonding material including an alloy consisting essentially of Au-Sn-Ni with Au as a main component, wherein a composition ratio of Ni is at least 1.3 wt %.

3. A mounting method of mounting an electrical element, comprising the steps of:

forming an electrode layer on an electrical element;

forming a Ni layer on said electrode layer;

forming a solder layer composed of an Au-Sn alloy with Au as a main component directly on said Ni layer; and heating said electrical element so as to cause said solder layer and said Ni layer to mutually diffuse as well as said electrode layer to ohmically contact said electrical element, thereby forming an Au-Sn-Ni alloy containing at least 1.3 wt % Ni and bonding said electrical element to a pedestal.

4. A mounting method of mounting an electrical element according to claim 3, wherein said step of forming said Ni layer includes a step of forming said Ni layer to a thickness of 500 Å or more.

5. A mounting method of mounting an electrical element according to claim 3, wherein said step of forming said solder layer includes a step of forming an Au-Sn alloy layer.

6. A mounting method of mounting an electrical element according to claim 5, wherein said step of forming said Au-Sn alloy layer includes a step of forming said Au-Sn alloy layer by physical vapor growth.

7. A mounting method of mounting an electrical element according to claim 6, wherein said step of forming said Au-Sn alloy layer includes a step of forming an eutectic Au-Sn alloy layer.

8. A mounting method of mounting an electrical element according to claim 7, wherein said step of forming said Ni layer includes a step of forming said Ni layer to a thickness of 70 nm to 120 nm, and said step of forming said eutectic Au-Sn alloy layer includes a step of forming said eutectic Au-Sn alloy layer to a thickness of approximately 1.5 μm.

9. A mounting method of mounting an electrical element according to claim 6, wherein said step of forming said Au-Sn alloy layer includes a step of forming said Au-Sn alloy layer to a thickness of 0.3 μm to 3 μm.

10. A mounting method of mounting an electrical element according to claim 5, wherein said step of forming said Au-Sn alloy layer includes a step of forming said Au-Sn alloy layer to a thickness of 0.3 μm to 3 μm.

11. A mounting method of mounting an electrical element according to claim 3, wherein said electrical element is composed of compound semiconductor substance, and said step of a forming said electrode layer includes a step of forming an Au-containing film on said electrical element.

12. The bonding material of claim 3, wherein said composition ratio of Ni is less than 10 wt %.

13. A method of bonding an electrical element to a pedestal, comprising the steps of:

forming a Ni layer and a solder layer composed of an Au-Sn alloy with Au as a main component successively on a mounting surface of an electrical element; and bonding said electrical element to a pedestal by heating and melting said solder layer to mutually diffuse Ni in said Ni layer and Sn in said solder layer, thereby forming an Au-Sn-Ni alloy containing at least 1.3 wt % Ni.

14. The bonding material of claim 13, wherein said composition ratio of Ni is less than 10 wt %.

15. A method of bonding an electrical element to a pedestal according to claim 13, wherein said step of bonding said electrical element includes a step of heating and solder layer to form an alloy layer containing Ni and Sn, a step of disposing said electrical element on said pedestal interposing said alloy layer therebetween, a step of heating said electrical element at a temperature higher than a melting point of said alloy layer, and a step of cooling said electrical element to bond said electrical element to said pedestal.

16. A method of bonding an electrical element according to claim 15, wherein said Ni layer is formed to a film thickness of 500 Å or more.

17. A method of bonding an electrical element according to claim 15, wherein said solder layer is formed by means of physical vapor growth using an alloy as an evaporation source.

18. A method of bonding an electrical element according to claim 15, wherein said solder layer is formed to a film thickness of 0.3 μm to 3 μm.

19. A method of bonding an electrical element according to claim 15, wherein said solder layer is composed of an Au-Sn alloy with Au as a main component and said step of bonding said electrical element includes a step of forming an Au-Sn-Ni alloy containing Ni for 1.3 wt % to 10 wt % by heating and melting said solder layer.

20. A method of bonding an electrical element according to claim 13, wherein said Ni layer is formed to a film thickness of 500 Å or more.

21. A method of bonding an electrical element according to claim 20, wherein said solder layer is formed to a film thickness of 0.3 μm to 3 μm.

22. A method of bonding an electrical element according to claim 20, wherein said solder layer is composed of an Au-Sn alloy with Au as a main component and said step of bonding said electrical element includes a step of forming an Au-Sn-Ni alloy containing Ni for 1.3 wt % to 10 wt % by heating and melting said solder layer.

23. A method of bonding an electrical element according to claim 13, wherein said solder layer is formed by physical vapor growth using an alloy as an evaporation source.

24. A method of bonding an electrical element according to claim 13, wherein said solder layer is formed to a film thickness of 0.3 μm to 3 μm.

25. A method of bonding an electrical element according to claim 24, wherein said solder layer is composed of an Au-Sn alloy with Au as a main component and said step of bonding said electric element includes a step of forming an Au-Sn-Ni alloy containing Ni for 1.3 wt % to 10 wt % by heating and melting said solder layer.

26. A method of bonding an electrical element according to claim 13, wherein a surface of said pedestal to which said electrical element is bonded is composed of a material selected from the group consisting of Au, Ni, Fe and Cu.

27. A method of bonding an electrical element according to claim 13, wherein said electrical element is a semiconductor laser device.

28. An electrical bonding assembly comprising:

an electrical element having an electrode;

a pedestal; and a bonding material bonding said electrode to said pedestal, said bonding material including an alloy comprising Au-Sn-Ni with Au as a main component;

wherein a composition ratio of Ni is at least 2.5 wt %.

29. An electrical bonding assembly according to claim 28, wherein said pedestal is composed of a material selected from the group consisting of Au, Ni, Fe and Cu on a surface to which said electrical element is to be bonded.

30. An electrical bonding assembly according to claim 28, wherein said electrical element is a semiconductor laser device.

* * * * *